United States Patent [19]

Kerr et al.

[11] Patent Number: 5,905,377

[45] Date of Patent: May 18, 1999

[54] METHOD AND APPARATUS FOR CORRECTING GRADIENT SYSTEM AND STATIC MAGNETIC FIELD IN MAGNETIC RESONANCE IMAGING

[75] Inventors: Adam B. Kerr, Palo Alto; John M. Pauly, San Francisco, both of Calif.

[73] Assignee: Board of Trustees of the Leland Stanford Junior University, Palo Alto, Calif.

[21] Appl. No.: 08/690,528

[22] Filed: Jul. 31, 1996

[51] Int. Cl.[6] .................................................. G01V 3/00
[52] U.S. Cl. ........................................... 324/309; 324/307
[58] Field of Search ................................... 324/300, 307, 324/309, 312; 128/653.2, 653.3

[56] References Cited

U.S. PATENT DOCUMENTS

| | | | |
|---|---|---|---|
| 5,138,259 | 8/1992 | Schmitt et al. | 324/309 |
| 5,184,073 | 2/1993 | Takeuchi et al. | 324/309 |
| 5,570,020 | 10/1996 | Bornert | 324/309 |
| 5,652,514 | 7/1997 | Zhang | 324/307 |

OTHER PUBLICATIONS

Adam B. Kerr et al., "Image Quality for Spiral–Based Sequences" Third Meeting SMR, Aug. 19, 1995, p. 622.
Adam Kerr et al., "Gradient Measurement and Characterization for Spiral and Echo–Planar Sequences", Fourth Meeting ISMRM, Apr. 27, 1996, p. 364.

A. Takahashi et al. "Applications of Measured K–Space Trajectories to RF Pulse Design and Image Reconstruction", Second Meeting SMR, Aug. 06, 1994, p. 484.

John I. Jackson et al., "Selection of Convolution Function for Fourier Inversion Using Gridding", IEEE Trans. on Medical Imaging, vol. 10, No. 3, Sep. 1991, pp. 473–478.

A. Takahashi et al., "Compensation of Multi–Dimensional Selective Excitation Pulses Using Measured k–Space Trajectories", MRM 34:446–456 (1995).

Primary Examiner—Kamini Shah
Attorney, Agent, or Firm—Townsend and Townsend and Crew LLP; Henry K. Woodward

[57] ABSTRACT

Time-varying error between a prescribed magnetic field and an actual magnetic field is identified from a self-encoding technique and the measurement of detected responses to various magnetic read-out gradients. The gradients can be a sinusoidal, step function, or other suitable form which enables the actual responses to be obtained from which transfer functions can be defined. In one embodiment, the data can effectively frequency sample the transfer function of the system. A gradient-recalled echo occurs each time the self-encode lobe is refocussed, and the phase of the echo peak is used to estimate the time variation of the main magnetic field, $B_0(t)$.

8 Claims, 10 Drawing Sheets

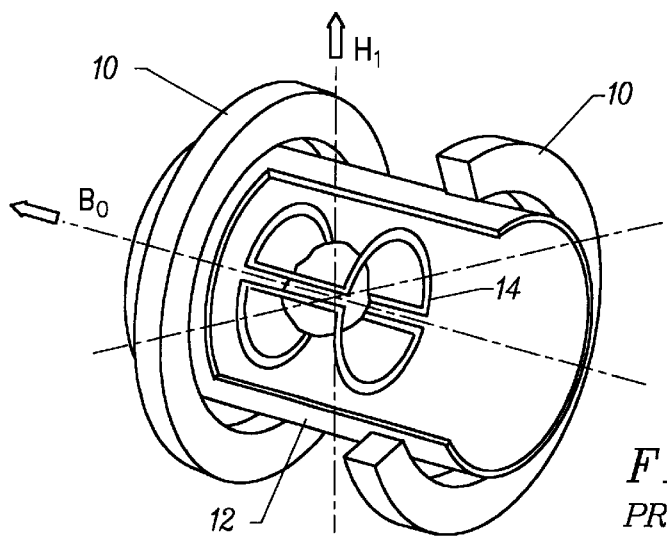
FIG. 1A
PRIOR ART
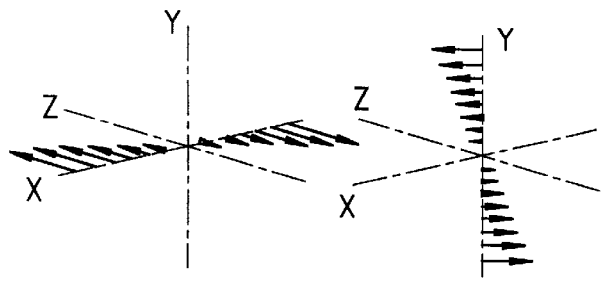
FIG. 1B
PRIOR ART
FIG. 1C
PRIOR ART
FIG. 1D
PRIOR ART
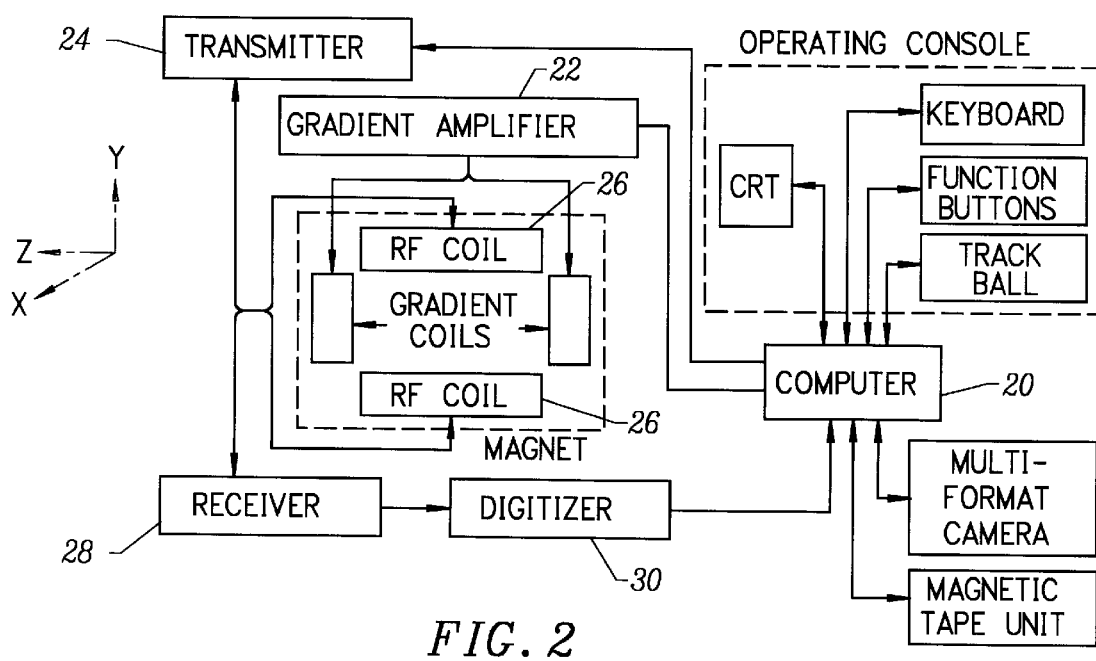
FIG. 2
PRIOR ART

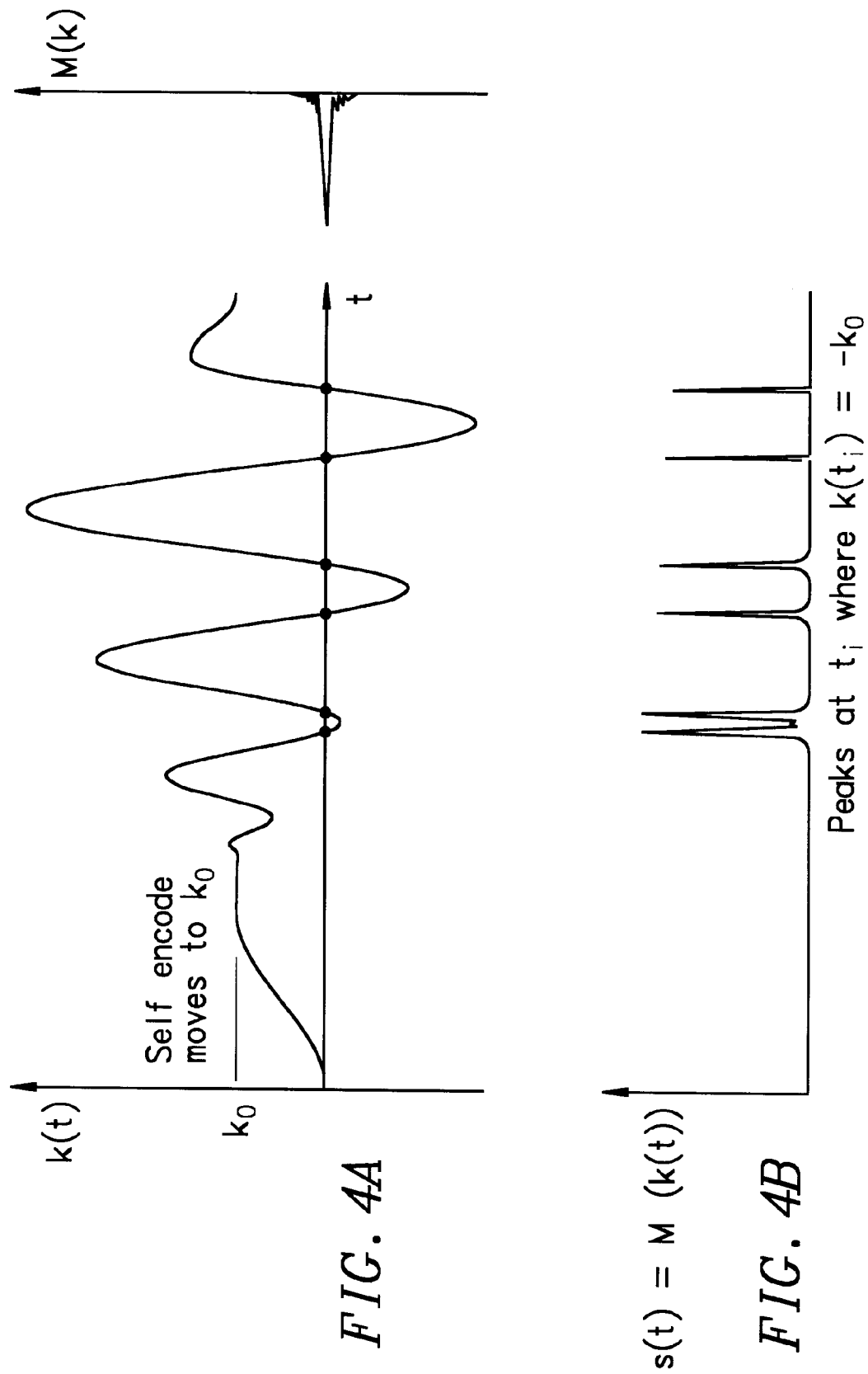

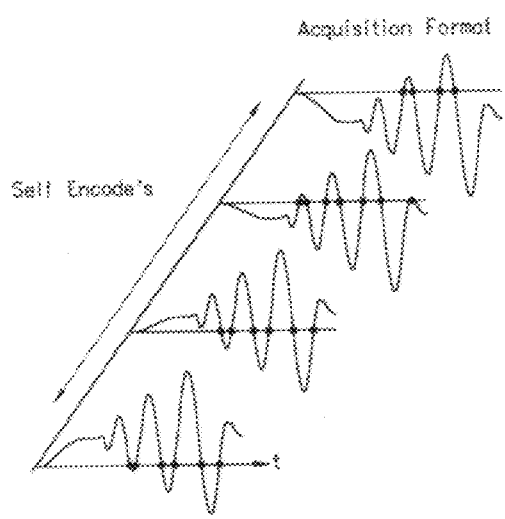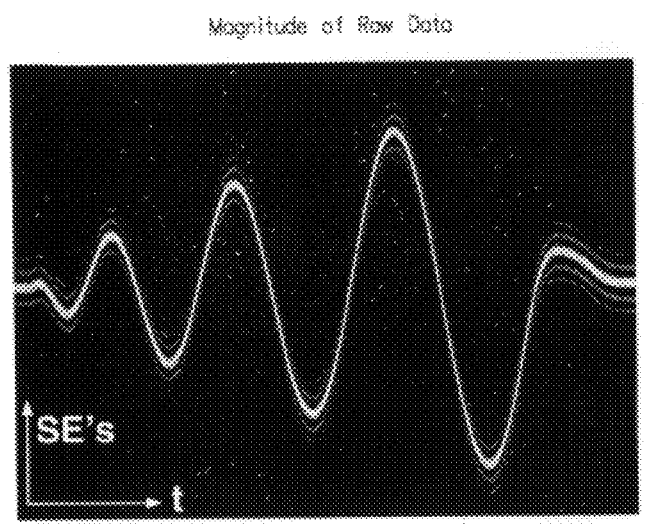
FIG. 5A                    FIG. 5B

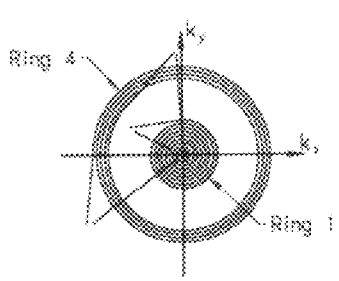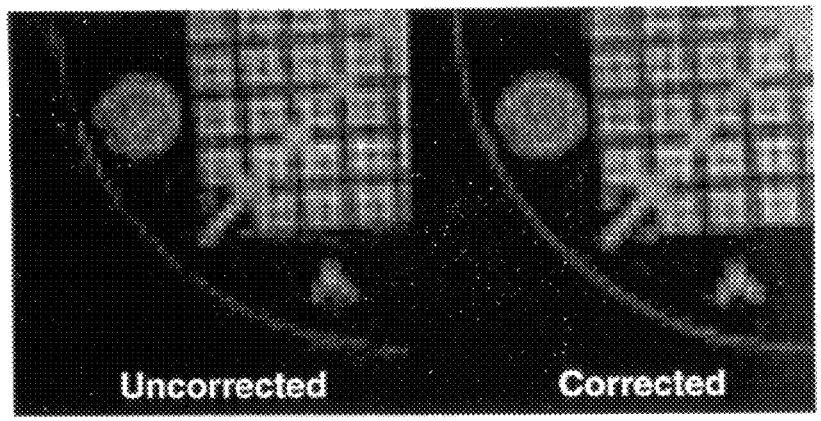
FIG. 7A        FIG. 7B        FIG. 7C

Parameters:
32-ring trajectory, 32-cm FOV, 1.62-mm resolution, 80-msTE, 2-s TR, 18-s scan time, axial slice through abdomen

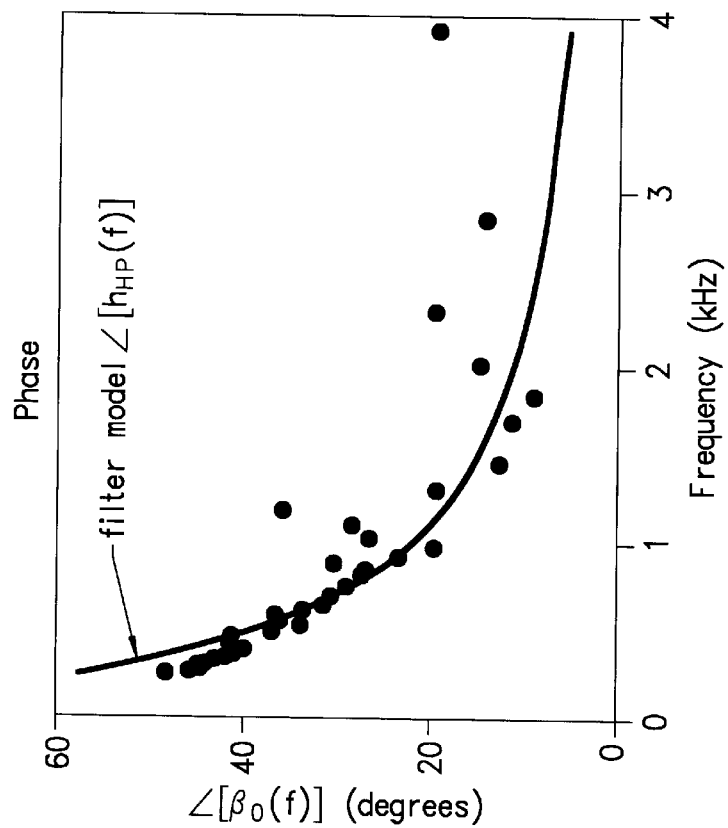
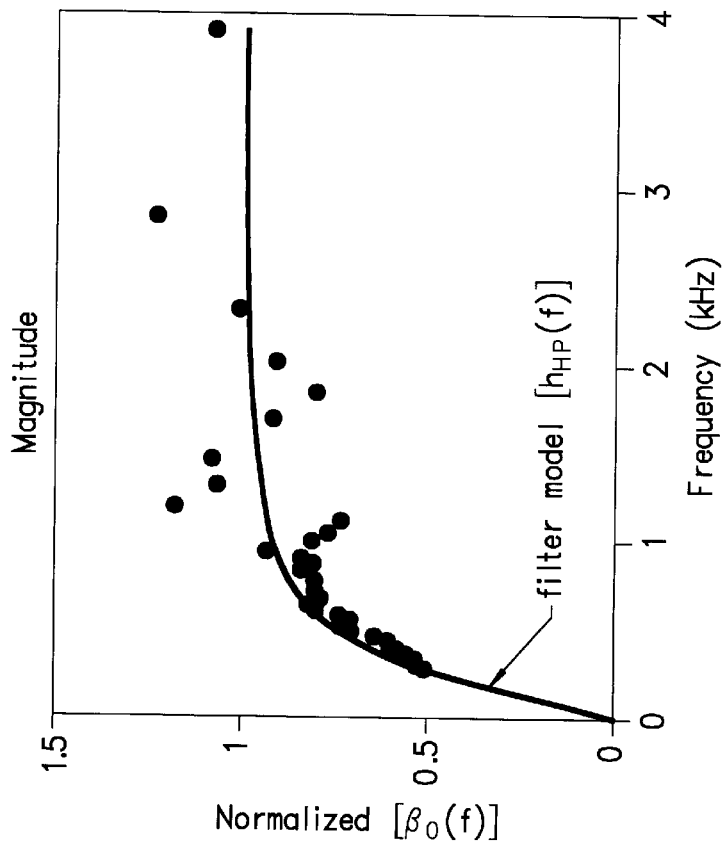
FIG. 9B
FIG. 9A

METHOD AND APPARATUS FOR CORRECTING GRADIENT SYSTEM AND STATIC MAGNETIC FIELD IN MAGNETIC RESONANCE IMAGING

The U.S. Government has rights in the invention pursuant to NIH Grant No. RO1CA50948 to Stanford University.

BACKGROUND OF THE INVENTION

This invention relates generally to magnetic resonance imaging, and more particularly the invention relates to the correction of gradient spatial encoding waveforms due to gradient system inaccuracy, magnetic field inhomogeneity, and eddy currents.

Magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Briefly, a strong static magnetic field is employed to line up atoms whose nuclei have an odd number of protons and/or neutrons, that is, have spin angular momentum and a magnetic dipole moment. A second RF magnetic field, applied as a single pulse traverse to the first, is then used to pump energy into these nuclei, flipping them over, for example to 90° or 180°. After excitation, the nuclei gradually return to alignment with the static field and give up the energy in the form of weak but detectable free induction decay (FID). These FID signals are used by a computer to produce images.

The excitation frequency, and the FID frequency, is defined by the Larmor relationship which states that the angular frequency $\omega_0$, of the procession of the nuclei is the product of the magnetic field $B_0$, and the so-called magnetogyric ratio, $\gamma$, a fundamental physical constant for each nuclear species:

$$\omega_0 = B_0 \times \gamma$$

Accordingly, by superimposing a linear gradient field, $B_z = Z \times G_z$, on the same static uniform field, $B_0$, which defines the Z axis, for example, nuclei in a selected X-Y plane can be excited by proper choice of the frequency spectrum of the transverse excitation field applied along the X or Y axis. Similarly, a gradient field can be applied in the X-Y plane during detection of the FID signals to spatially-localize the FID signals in the plane. The angle of nuclear spin flip in response to an RF pulse excitation is proportional to the integral of the pulse over time.

A k-space interpretation of nuclei excitation is given by Pauly, Nishimura, and Macovski in "A k-space Analysis of Small-Tip-Angle Excitation," Journal of Magnetic Resonance 81, 43–56 (1989).

Eddy currents and gradient system imperfections give rise to a time-varying error between a prescribed magnetic field and the actual magnetic field. Takahashi et al, MRM 34: 446, 1995 measure the actual field by using a self-encoding technique which uses a separate calibration sequence to measure one dimensional trajectories in k-space. Essentially, a self-encoding gradient lobe moving to $k_0$ in k-space is applied, then data is acquired while applying the test waveform. A gradient-recalled echo occurs each time the self-encode lobe is refocussed. These echo time indicate when $k_0$ is reached by the test waveform. In practice, multiple self encodes and acquisitions are used, with echo peak interpolation done against self-encode values to determine the actual k-space trajectory. Peak interpolation is performed by fitting a Gaussian curve using least-squares.

The present invention utilizes gradient, $G(t)$, measurements, as described by Takahashi et al., in spin echo, echo-planar, and spiral imaging. Additionally, the actual phase of the static magnetic field, $B_0(t)$, is determined using a self-encode method.

SUMMARY OF THE INVENTION

In accordance with the invention, time-varying error between a prescribed magnetic field and an actual magnetic field is identified from a self-encoding technique and the measurement of detected responses to various magnetic read-out gradients. The gradients can be a sinusoidal, step function, or other suitable form which enables the actual responses to be obtained from which transfer functions can be defined. In one embodiment, the data can effectively frequency sample the transfer function of the system. A gradient-recalled echo occurs each time the self-encode lobe is refocussed, and the phase of the echo peak is used to estimate the time variation of the main magnetic field, $B_0(t)$.

Compensation for the magnetic and gradient errors is done during image reconstruction when measured rather than designed k-space trajectories are used.

The invention and objects and features thereof will be more readily apparent from the following detailed description and appended claims when taken with the drawings.

BRIEF DESCRIPTION OF THE DRAWINGS

FIGS. 1A, 1B, 1C and 1D illustrate the arrangement of convention MRI apparatus and magnetic fields generated therein.

FIG. 2 is a functional block diagram of MRI imaging apparatus.

FIGS. 4A and 4B illustrate an applied gradient versus k(t) with self-encoding and the received signal peaks where $k(t)=-k_0$, respectively.

FIGS. 5A and 5B illustrate four acquisition formats for four different encodes and a plot of detected measurements of echo peaks for a plurality of different self-encoded gradients, respectively.

FIGS. 7A, 7B and 7C are a spiral ring k-space trajectory, an image from uncorrected image signals, and an image from corrected image signals in accordance with the invention.

FIGS. 9A and 9B are plots of magnitude versus frequency and phase versus frequency for a sampled transfer function.

DETAILED DESCRIPTION OF THE PREFERRED EMBODIMENT

Figure 3:
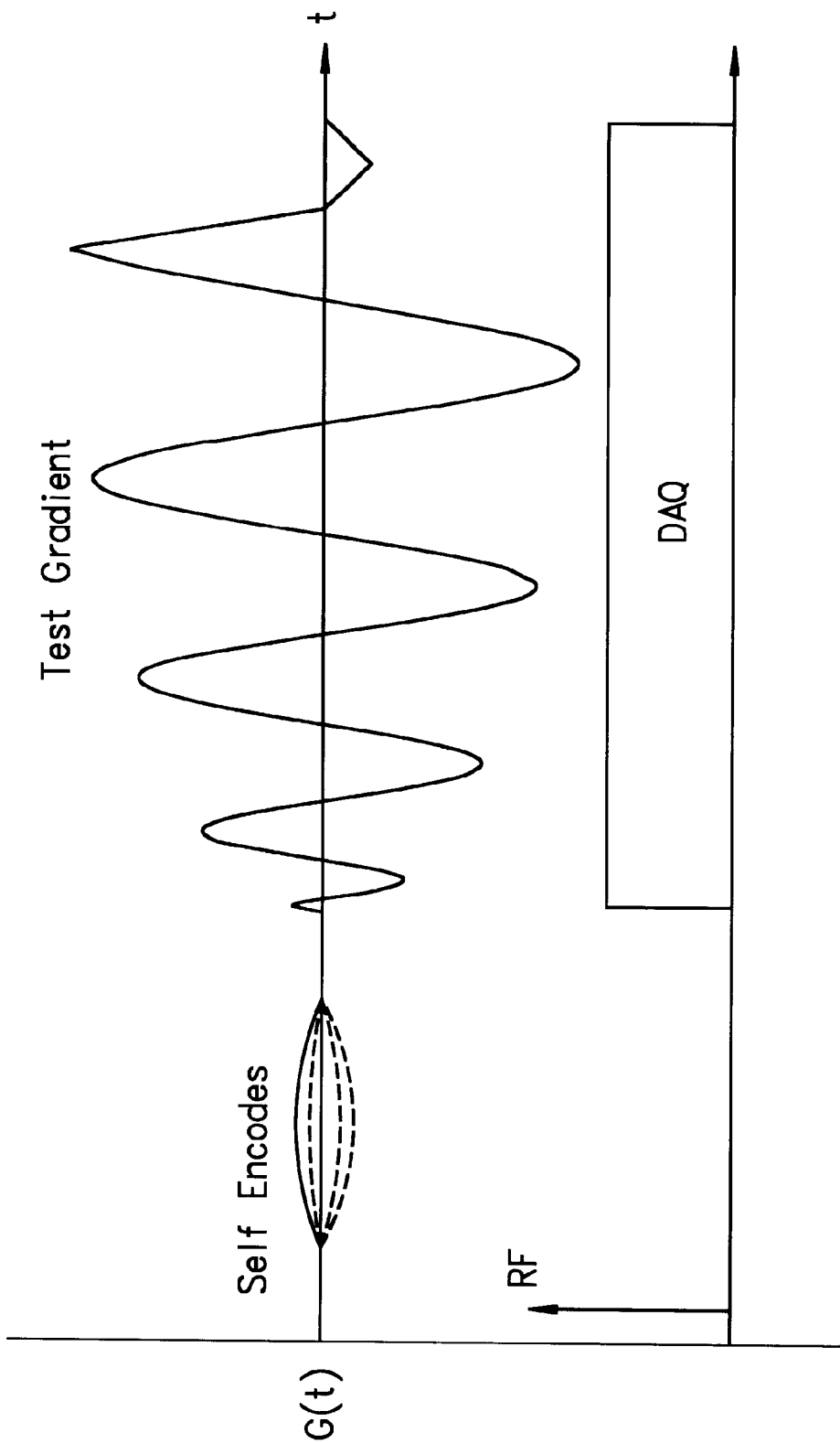
FIG. 3 illustrates a pulse sequence including self-encode lobes and a test gradient waveform.

Referring now to the drawings, FIG. 1A is a perspective view partially in section illustrating coil apparatus in an NMR imaging system, and Figs. 1B–1D illustrate field gradients which can be produced in the apparatus of FIG. 1A. This apparatus is discussed by Hinshaw and Lent, "An Introduction to NMR Imaging: From the Bloc Equation to the Imaging Equation," Proceedings of the IEEE, Vol. 71, No. 3, March 1983, pp. 338–350. Briefly, the uniform static field $B_0$ is generated by the magnet comprising the coil pair 10. A gradient field G(x) is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but does not vary with distance along the Y or Z axes. FIGS. 1C and 1D are similar representation of the Y gradient and Z gradient fields, respectively.

FIG. 2 is a functional block diagram of the imaging apparatus as disclosed in *NMR-A Perspective in Imaging*, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency are controlled by the transmitter 24 and the RF coils 26. After the selected nuclei have been flipped, the RF coils 26 are employed to detect the FID signal which is passed to the receiver 28 and thence through digitizer 30 for processing by computer 20.

Gradient system imperfections and eddy currents give rise to a time-varying error between prescribed and actual magnetic field which can have a profound effect on image quality in spiral and echo-planar sequences. In accordance with the invention, image artifacts and blur are reduced by an accurate knowledge of the magnetic fields during readout.

To measure the actual fields, a self-encoding technique illustrated in FIG. 3 is employed. As described by Takahashi et al., supra, a self-encoding gradient lobe moving to $k_0$ in k-space is applied, then data is acquired while applying a test waveform. A gradient-recalled echo occurs each time the self-encode lobe is refocussed. These echo times indicate when $k_0$ is reached by the test waveform. In practice, multiple self encodes and acquisitions are used, with echo peak interpolation done against self-encode values to determine the actual k-space trajectory. Peak interpolation is performed by fitting a Gaussian curve using least-squares.

The invention uses the phase of the echo peak $\hat{\theta}(t)$ to estimate $$\Theta(t) = \int_0^t \gamma B_0(\tau)\, d\tau.$$

For 2-D gradient waveforms, $\hat{\theta}(t)$ is determined by adding the $\hat{\theta}_x(t)$ and $\hat{\theta}_y(t)$ independently measured for each of the two channels.

To correct for the k-space trajectory, the measured, rather than the ideal k-space trajectory, is used in a gridding reconstruction. See Jackson et al., "Selection of a Convolution Function for Fourier Inversion Using Gridding", *IEEE Transactions on Medical Imaging*, Vol. 10, No. 3, September 1991, pp 473–478. Phase accumulation due to the time-varying main field $B_0(t)$ is also removed by demodulating the received data with $\exp[-i\hat{\theta}(t)]$.

For system characterization we use the measurement technique to determine the response to sinusoidal gradients of different frequencies. Other suitable gradient forms such as a step-function can be used. This data effectively frequency samples the transfer function of the system. We then fit an approximating function, such as a first-order filter, to the sample points which can then be used to predict the output of the system to any applied gradient G(t).

FIG. 3 illustrates a pulse sequence including an RF excitation pulse followed by a self-encode gradient and then the test gradient. Data is measured during the application of the test gradient. The sequence is repeated using different self-encode gradients whereby echo peaks occur when the test gradient passes $k_0$ for different periods of time following gradient application. The phase $\hat{\theta}(t)$ is determined from the complex measurement of echo peaks. FIGS. 4A and 4B illustrate measured echo peaks for one self encoded gradient, and FIG. 5A illustrates four gradients, each with a different self-encode. FIG. 5B is a plot of the magnitude of measured peak echoes for a large number of different self encoded gradients.

The analyses of the measured data using the phase of the echo peak $\hat{\theta}(t)$ provides an estimate of $$\Theta(t) = \int_0^t \gamma B_0(\tau)\, d\tau.$$

For two dimensional gradient waveforms, $\hat{\theta}(t)$ is determined by adding $\hat{\theta}_x(t)$ and $\hat{\theta}_y(t)$ which are independently measured. Correction of errors can then be made in linear gradient terms during reconstruction using the measured k-space trajectory $\hat{k}(t)$. In an imaging application, the $B_0(t)$ induced phase can be removed by demodulating received data by $e^{-i\hat{\theta}(t)}$.

Figure 6A:
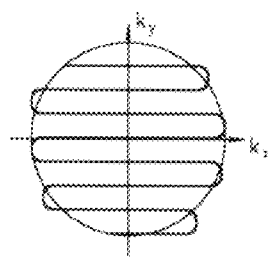
FIGS. 6A, 6B and 6C are a k-space trajectory, an image from uncorrected image signals, and an image from corrected image signals in accordance with the invention.
Figure 6B:
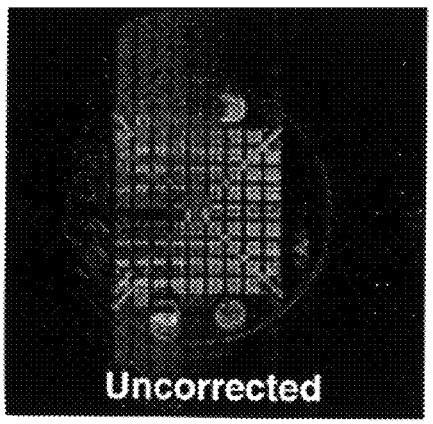
Figure 6C:
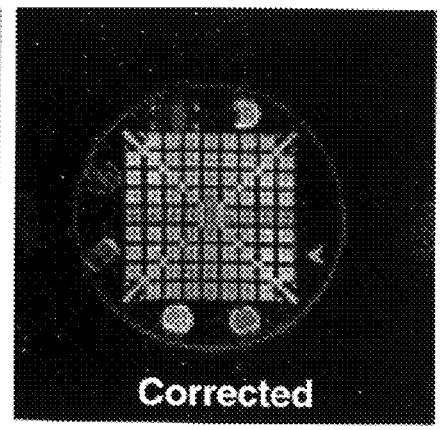

FIG. 6 illustrates a CEPI trajectory with 16 interleaves, 12 ms readouts, and 32 cm FOV (128×128 pixels) using a standard GE 1.5T Signa machine. FIG. 6 illustrates an uncorrected image having ghosts and blurring. The image of FIG. 6C is corrected for $\hat{k}(t)$ and $\hat{\theta}(t)$ in accordance with the invention.

FIG. 7A illustrates a spiral ring trajectory having 16 rings, 8 ms readouts, 32 cm FOV (128×128 pixels) against using a standard GE 1.5T Signa machine. FIG. 7B illustrates an uncorrected image, and FIG. 7C is an image corrected for $\hat{k}(t)$ and $\hat{\theta}(t)$ in accordance with the invention.

Figure 8A:
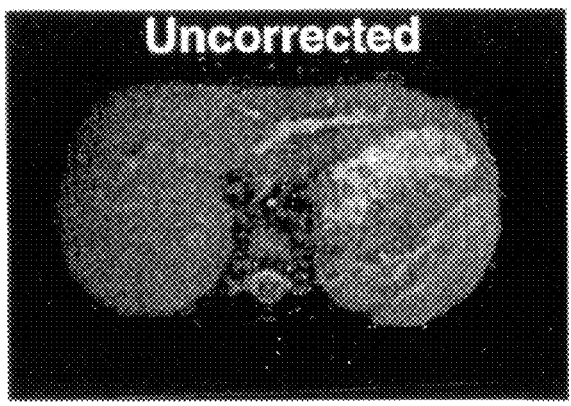
FIGS. 8A and 8B are an uncorrected image and a corrected image of an axial slice through an abdomen, respectively.
Figure 8B:
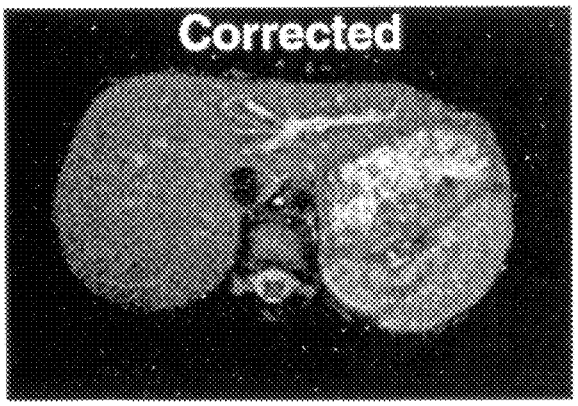

FIGS. 8A and 8B are axial slices through the abdomen, uncorrected and corrected, using a 32-ring trajectory in a RARE sequence, 32 cm FOV and 1.62 mm resolution. The images are based on 80 ms TE and 18s scan time. The improved fidelity of the corrected axial slice is evident in the image of the stomach, spine, liver and spleen.

Figure 10:
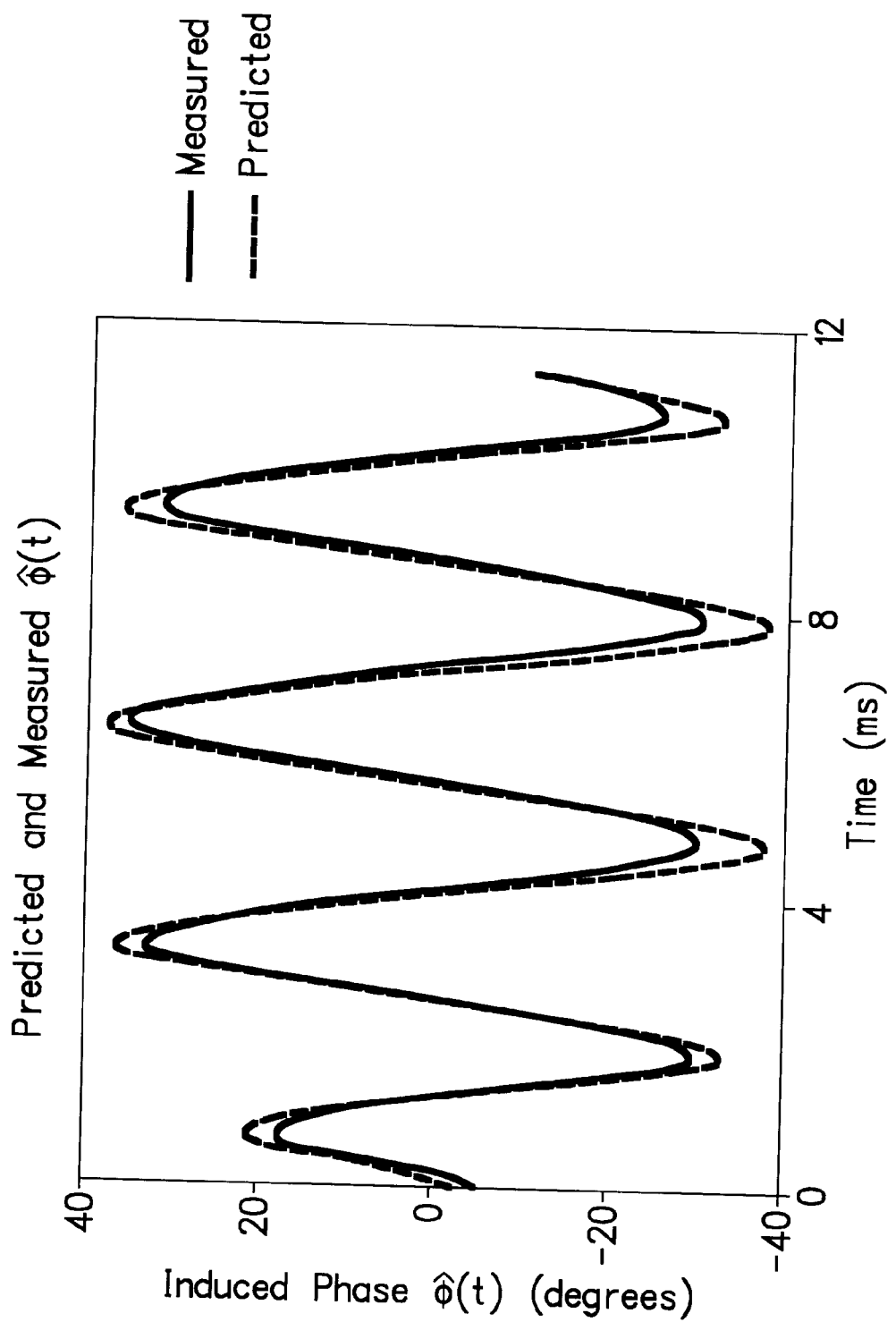
FIG. 10 is a plot of predicted versus measured phase correction of a detected magnetic resonance signal.

FIGS. 9A and 9B are plots of magnitude and phase versus frequency of a sampled transfer function $\beta_0(f)$ relating to $\hat{\theta}(t)$ to a gradient input G(t), and FIG. 10 illustrates predicted and measured induced phase $\hat{\theta}(t)$ for a single CEPI interleave. The prediction in accordance with the invention closely tracks the actual measured $\hat{\theta}(t)$.

Figure 11A:
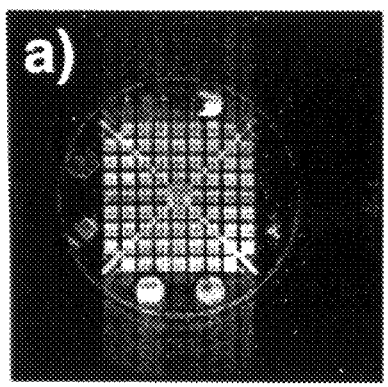
FIGS. 11A, 11B and 11C are images which are uncorrected for phase, corrected for predicted phase in accordance with the invention, and corrected based on measured phase correction.
Figure 11B:
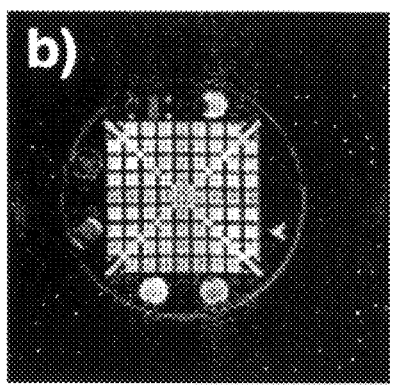
Figure 11C:
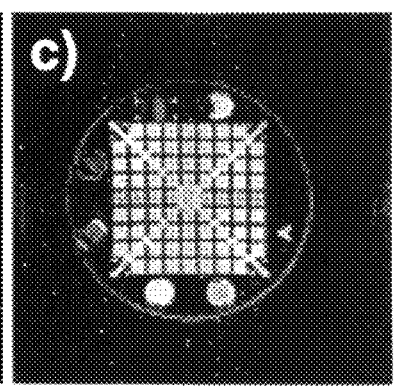

Figs. 11A, 11B and 11C are CEPI images which are all corrected for $\hat{k}(t)$, but FIG. 11A is not corrected for $\hat{\theta}(t)$ and FIG. 11C is corrected based on measured $\hat{k}(t)$.

The gradient characterization is also useful for the selective excitation aspect of MRI. In the Pauly k-space U.S. Pat. No. 4,985,577, it was shown that selective excitation can be analyzed as applying a weighting in excitation k-space. Gradient errors result in the actual k-space trajectory being different than the ideal trajectory, just as in imaging. However, once the trajectory and $B_0$ phase shifts are determined by the method described above, they can be incorporated into the design as described in the Pauly k-space patent, and thereby corrected. This is particularly useful for half-pulse excitation (Pauly et al., U.S. Pat. No. 5,025,216). It can be applied to correcting phase errors in the refocusing pulses used in rare imaging methods as described in J. Hennig et al., "Rare Imaging: A Fast Imaging Method for Clinical MR," *Magnetic Resonance in Medicine*, Vol. 3, pps 823–833, 1986.

There has been described a method for measuring the $B_0(t)$ response to an applied gradient with correction of a transfer function for applied gradient and detected output for both magnitude and phase of the output response. While the invention has been described with reference to specific embodiments, the description is illustrative of the invention and not limiting the invention. Various modifications and application may occur to those skilled in the art without departing from the true spirit and scope of the invention as defined by the appended claims.

What is claimed is:

1. In a method of correcting for effects of gradient system inaccuracy, inhomogeneous magnetic fields, and magnetic eddy currents on a detected signal during application of a time varying read-out magnetic gradient in a magnetic resonance imaging system, a sequence of steps comprising:

a) placing an object in a magnetic field ($B_0$) to align nuclei spins, b) applying an RF excitation pulse to said object to tilt nuclei spins, c) applying a self encoding magnetic gradient to said object, d) applying a time varying read-out magnetic gradient to said object, e) detecting time domain signals emitted from said object during application of said read-out magnetic gradient, f) repeating steps b) through e) for different self encoding magnetic gradients, g) processing said time domain signals to extract k-space positions of said signals as a function of time, h) processing said time domain signals to establish time-variation of the static magnetic field $B_0$ (t), including determining phase of a detected signal echo peak, $\theta(t)$, when $$\theta(t) \text{ as } \int_o^t -\gamma B_o(\tau) d\tau,$$

and i) correcting said time domain signals for eddy current and gradient system imperfections from step g) and for time variation of the magnetic field (Bo) from step h).

2. The method as defined by claim 1 wherein step g) includes determining a transfer function of k-space position, k(t) $\theta(t)$.

3. The method as defined by claim 2 wherein phase errors on an echo train caused by varying $B_0(t)$ are corrected to reduce image artifacts in rare imaging.

4. The method as defined by claim 2 wherein ghosting artifacts and geometric distortions are eliminated in echo-planar imaging by constructing images with corrected k-space trajectory.

5. The method as defined by claim 2 wherein geometric distortion, artifacts and blurring are reduced in spiral imaging by reconstructing images with corrected k-space trajectories.

6. The method as defined by claim 2 wherein half-pulse excitations in short-TE imaging are improved by correcting for $B_0(t)$.

7. A method for correcting for effects of inhomogeneous magnetic fields on a detected signal during application of a time varying read-out magnetic gradient in a magnetic resonance imaging system comprising the steps of:

a) placing an object in a magnetic field ($B_0$) to align nuclei spins, b) applying an RF excitation pulse to said object to tilt nuclei spins, c) applying a self encoding magnetic gradient to said object, d) applying a time varying read-out magnetic gradient to said object, e) detecting time domain signals emitted from said object during application of said read-out magnetic gradient, f) repeating steps b) through e) for different self encoding magnetic gradients, g) processing said time domain signals to establish time-variation of $B_0$ (t), including determining phase of a detected signal echo peak, $\hat{\theta}$ (t) when $k(t_i) = -k_0$ and estimating $$\theta(t) \text{ as } \int^t \gamma B_o(\tau) d\tau,$$

and h) using calculated time-variation of $B_0$ (t) to correct for effects of inhomogeneous magnetic fields on time domain signals during image reconstruction.

8. Magnetic resonance imaging apparatus for use in correcting for effects of inhomogeneous magnetic fields on a detected signal during application of a time varying read-out magnetic gradient comprising the steps of:

a) magnet means for applying a magnetic field ($B^o$) through an object to align nuclei spins, b) means for applying an RF excitation pulse to said object to tilt nuclei spins, c) means for applying a self encoding magnetic gradient to said object, d) means for applying a time varying read-out magnetic gradient to said object, e) means for detecting time domain signals emitted from said object during application of said read-out magnetic gradient for different self encoding magnetic gradients including determining phase of a detected signal echo peak, $\hat{\theta}$ (t) when $k(t_i) = -k_0$ and estimating $$\theta(t) \text{ as } \int^t \gamma B_o(\tau) d\tau,$$

f) means for processing said time domain signals to establish time-variation of $B_0$ (t) and measured k-space trajectories, and g) means for correcting for time variation of the magnetic field (Bo) on time domain signals using measured k-space trajectories.

\* \* \* \* \*